(12) United States Patent
Nunokawa

(10) Patent No.: US 9,824,939 B2
(45) Date of Patent: Nov. 21, 2017

(54) SEMICONDUCTOR ASSEMBLY AND METHOD TO FORM THE SAME

(71) Applicant: SUMITOMO ELECTRIC DEVICE INNOVATIONS, INC., Yokohama-shi, Kanagawa (JP)

(72) Inventor: Mitsuji Nunokawa, Kai (JP)

(73) Assignee: SUMITOMO ELECTRIC DEVICE INNOVATIONS, INC., Yokohama-Shi, Kanagawa (JP)

( * ) Notice: Subject to any disclaimer, the term of this patent is extended or adjusted under 35 U.S.C. 154(b) by 0 days.

(21) Appl. No.: 15/085,610

(22) Filed: Mar. 30, 2016

(65) Prior Publication Data

US 2016/0293499 A1 Oct. 6, 2016

(30) Foreign Application Priority Data

Apr. 1, 2015 (JP) ................. 2015-075312

(51) Int. Cl.
*H01L 21/66* (2006.01)
*H01L 21/52* (2006.01)
*H01L 21/48* (2006.01)
*H01L 23/00* (2006.01)

(52) U.S. Cl.
CPC .......... *H01L 22/14* (2013.01); *H01L 21/4889* (2013.01); *H01L 21/52* (2013.01); *H01L 22/32* (2013.01); *H01L 24/03* (2013.01); *H01L 24/13* (2013.01); *H01L 24/16* (2013.01); *H01L 2224/0346* (2013.01); *H01L 2224/0401* (2013.01); *H01L 2224/05558* (2013.01); *H01L 2224/05572* (2013.01); *H01L 2224/13111* (2013.01); *H01L 2224/16227* (2013.01); *H01L 2224/94* (2013.01); *H01L 2924/10329* (2013.01); *H01L 2924/13064* (2013.01)

(58) Field of Classification Search
CPC ................. H01L 22/14; H01L 21/4853; H01L 2224/0392
See application file for complete search history.

(56) References Cited

U.S. PATENT DOCUMENTS

2013/0154108 A1* 6/2013 Lin ..................... H01L 23/5389
257/774

FOREIGN PATENT DOCUMENTS

JP 2005-214753 8/2005

* cited by examiner

*Primary Examiner* — Marc Armand
(74) *Attorney, Agent, or Firm* — Smith, Gambrell & Russell, LLP

(57) ABSTRACT

A semiconductor device having a composite pad including a primary portion and a subsidiary portion is disclosed. The primary portion is provided for electrical connection to an internal circuit of the semiconductor device. The subsidiary portion is provided for probing, in particular, for testing high frequency performance of the semiconductor device by probing with a RF-probe. Because the subsidiary portion is independent from the primary portion, the subsidiary portion does not affect the electrical performance of the semiconductor device. Also, the subsidiary portion has a narrowed contact area with respect to the RF-probe to lessen adherence of metal flakes from the pad onto the probe.

7 Claims, 14 Drawing Sheets

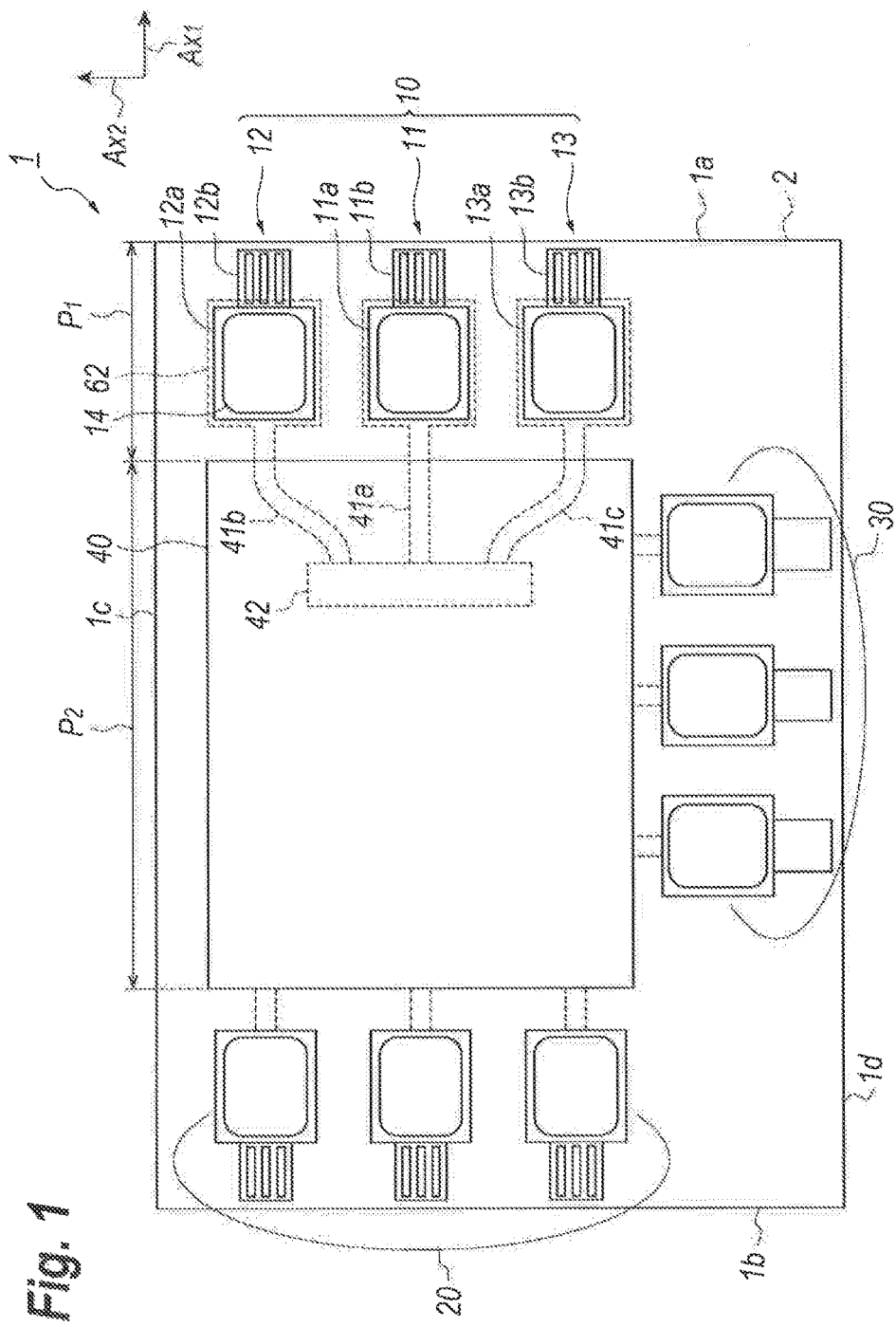

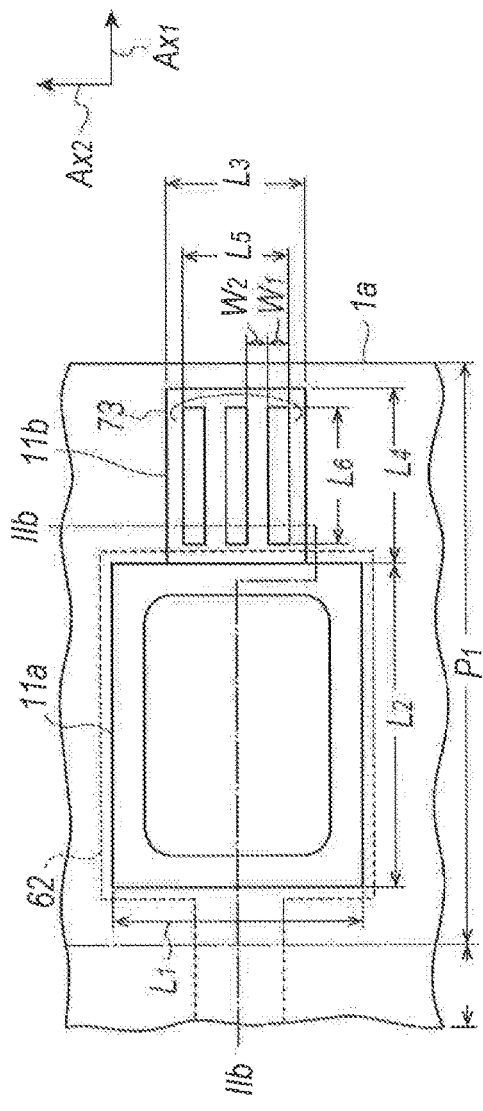
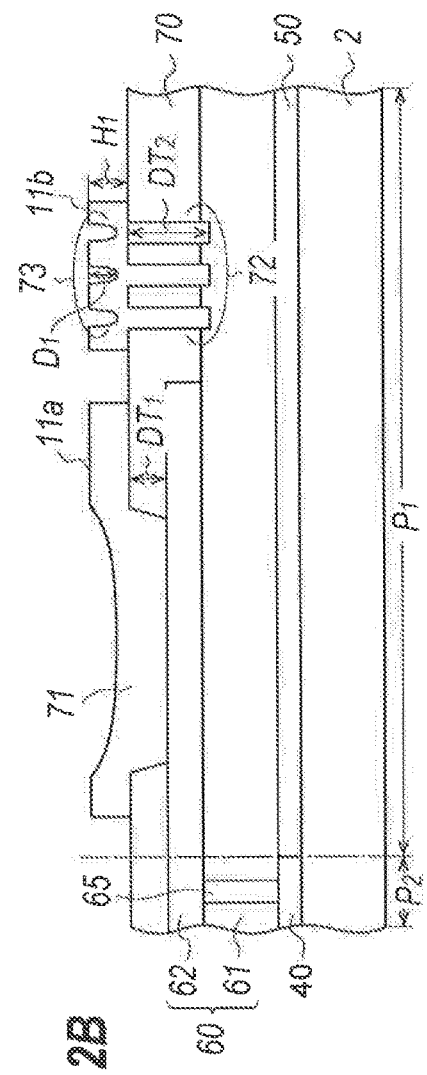
Fig. 2A
Fig. 2B

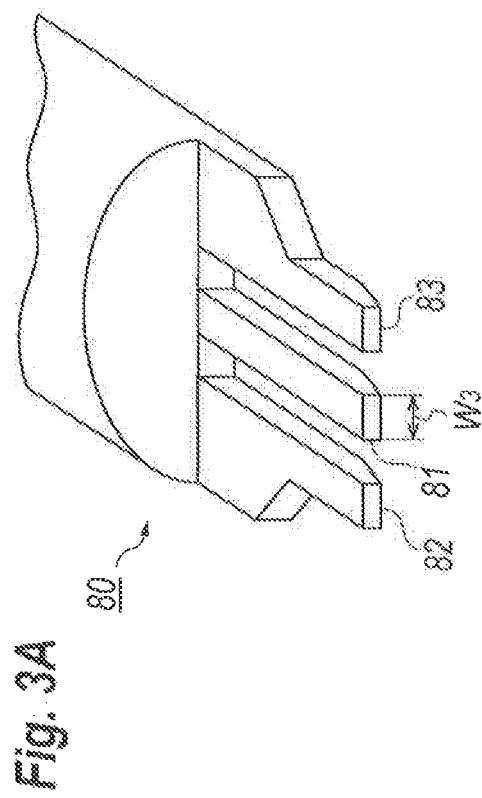
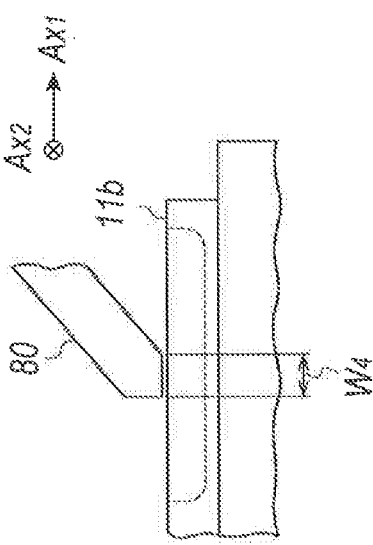
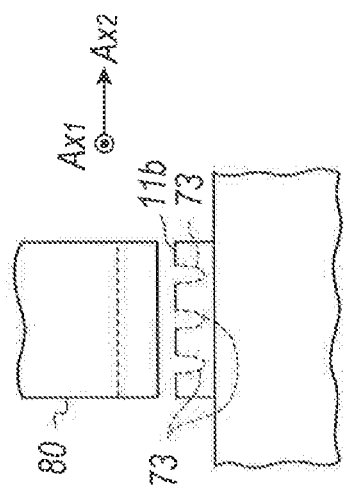

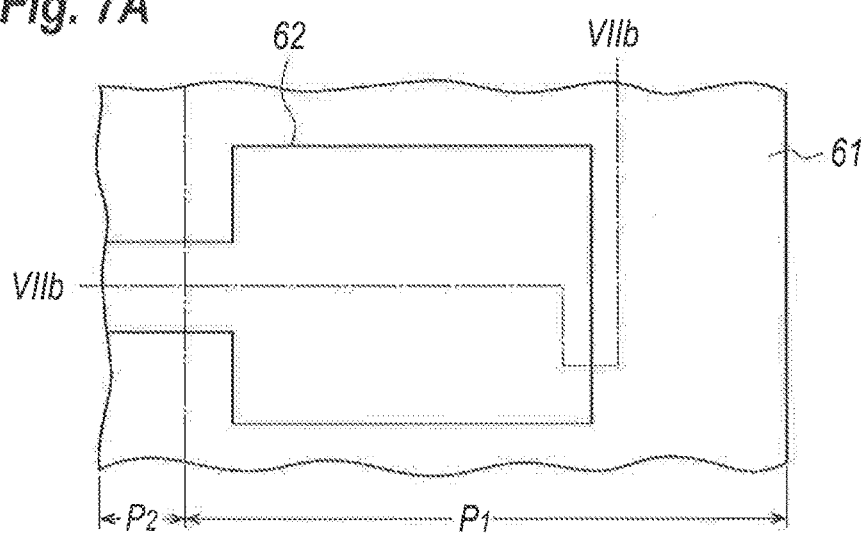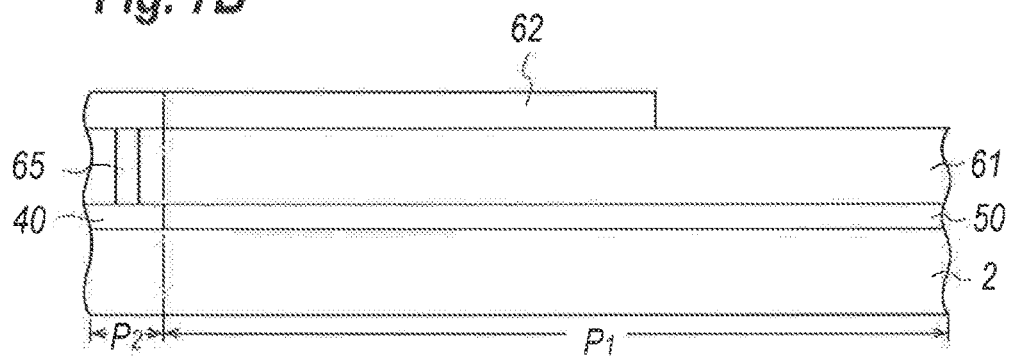

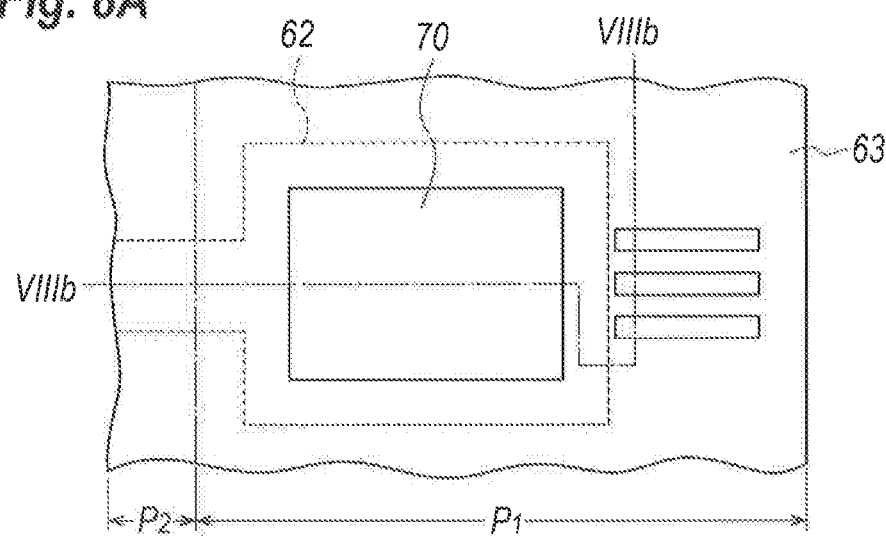
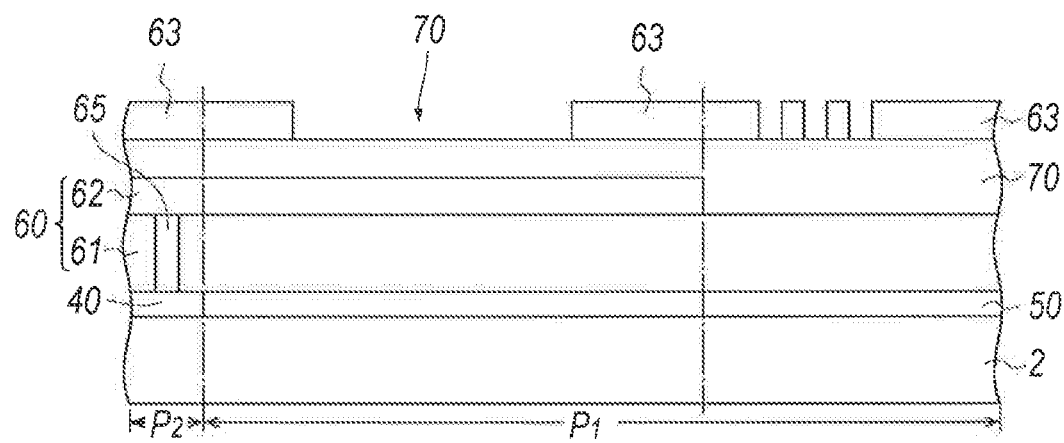

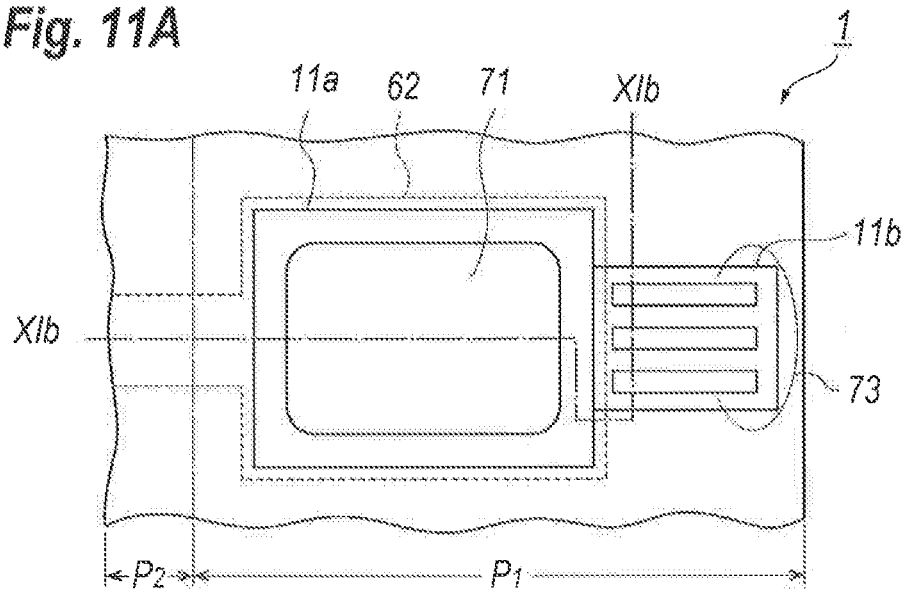
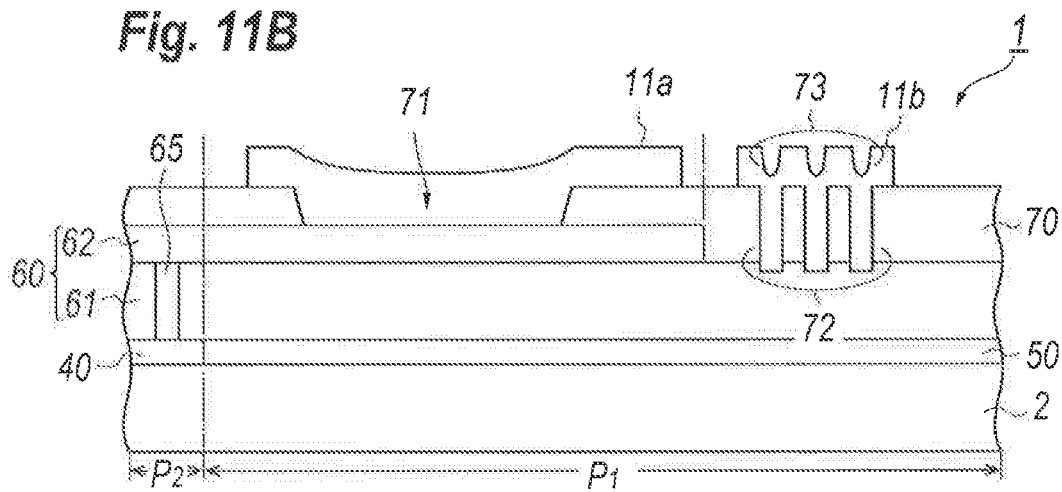

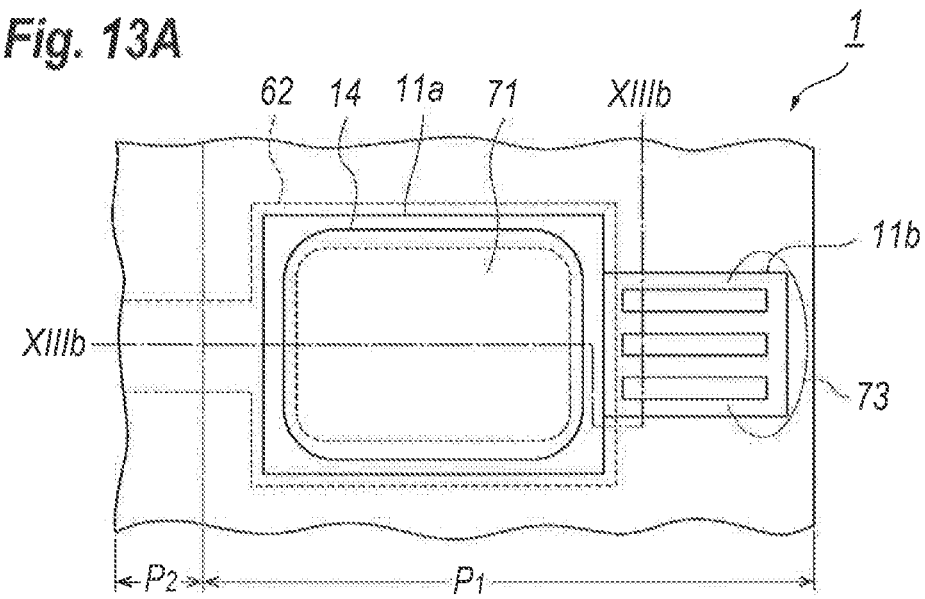
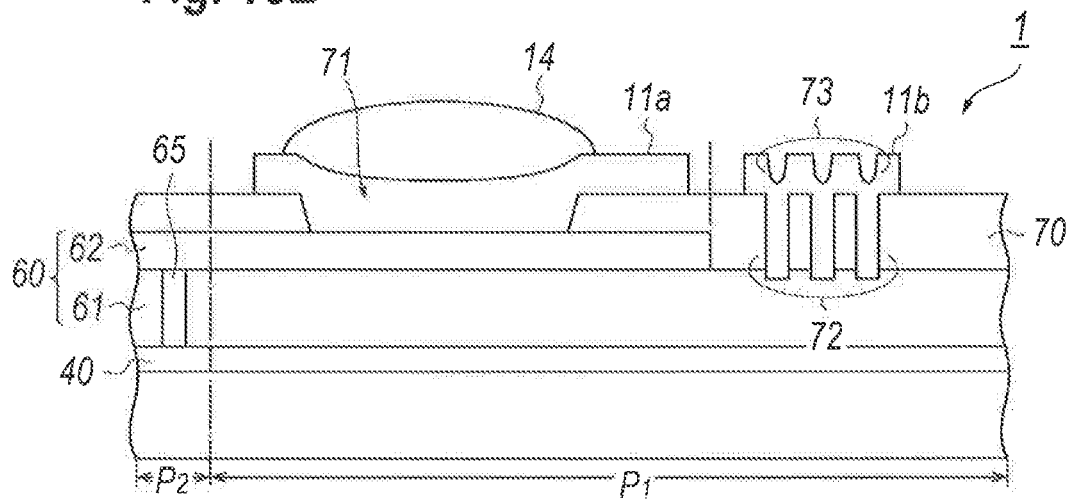

SEMICONDUCTOR ASSEMBLY AND METHOD TO FORM THE SAME

BACKGROUND OF THE INVENTION

1. Field of the Invention

The present invention relates to a semiconductor device and a method to test the semiconductor device.

2. Background Arts

A Japanese patent application published as JP-2005-214753 has disclosed a semiconductor device and a method to test the semiconductor device. The semiconductor device disclosed therein provides test pads for testing the semiconductor device, and a technique to test the semiconductor device using the test pads. A semiconductor device is usually tested in electrical performance thereof before dicing and assembling in a wafer level. The test may be carried out by probing pads, and detaches the probes from the pads after the testing. However, the probing to the pads often causes damages in the pads, and flakes of pad metals adheres onto the probe, which restricts repetitive use of the probes.

SUMMARY OF THE INVENTION

One aspect of the present application relates to a semiconductor assembly. The semiconductor assembly of the present invention includes a semiconductor device and a support. The semiconductor device includes a device area and a peripheral area. The device area provides a semiconductor element, while, the peripheral area provides a signal pad connected to the semiconductor element in the device area through an interconnection. The signal pad includes a primary portion and a subsidiary portion arranged outside of the primary portion with respect to the device area. The support mounts the semiconductor device thereon in the primary portion through a metal member. A feature of the present semiconductor assembly is that the subsidiary portion has hollows extending in parallel toward the device area.

Another aspect of the present application relates to a process for producing a semiconductor assembly. The semiconductor assembly may include a semiconductor device and a support that mounts the semiconductor device thereon. The semiconductor device may include a device area and a peripheral area, where the device area provides a semiconductor element therein, and the peripheral area provides a signal pad electrically connected to the semiconductor element through an interconnection. The signal pad includes a primary portion and a subsidiary portion, where the subsidiary portion has hollows extending in parallel toward the device area. The process of the present invention includes steps of: (a) forming the primary portion and the subsidiary portion of the signal pad in the peripheral aria; (b) testing performance of the semiconductor device by touching a probe to the subsidiary portion after sliding the probe along the hollows; and (c) mounting the semiconductor device onto the support in upside down such that the primary portion and the subsidiary portion faces the support.

BRIEF DESCRIPTION OF THE DRAWINGS

The foregoing and other purposes, aspects and advantages will be better understood from the following detailed description of a preferred embodiment of the invention with reference to the drawings, in which:

FIG. 1 is a plan view schematically illustrating a semiconductor device that provides a peripheral area and a device area, where the former area arranges pads of the first group, while, the latter area arranges an internal circuit;

FIG. 2A is a plan view of the signal pad and FIG. 2B shows a cross section of the semiconductor device around the signal pad thereof, which is taken along the line IIb-IIb appearing in FIG. 2A;

FIGS. 3A to 3C schematically show the probe for the high frequency test of the semiconductor device, which is generally called as the RF (radio frequency) probe;

FIG. 7A is a plan view of the semiconductor device at a step of the manufacturing process subsequent to the step shown FIG. 6A, and FIG. 7B shows a cross section taken along the line VIIb-VIIb indicated in FIG. 7A;

FIG. 8A is a plan view of the semiconductor device at a step of the manufacturing process subsequent to the step shown FIG. 7A, and FIG. 8B shows a cross section taken along the line VIIIb-VIIIb indicated in FIG. 8A;

FIG. 11A is a plan view of the semiconductor device at a step of the manufacturing process subsequent to the step shown FIG. 10A, and FIG. 11B shows a cross section taken along the line XIb-XIb indicated in FIG. 11A;

FIG. 13A is a plan view of the semiconductor device at a step of the manufacturing process subsequent to the step shown FIG. 12A, and FIG. 13B shows a cross section taken along the line XIIIb-XIIIb indicated in FIG. 13A.

DESCRIPTION OF EMBODIMENT

Figure 4:
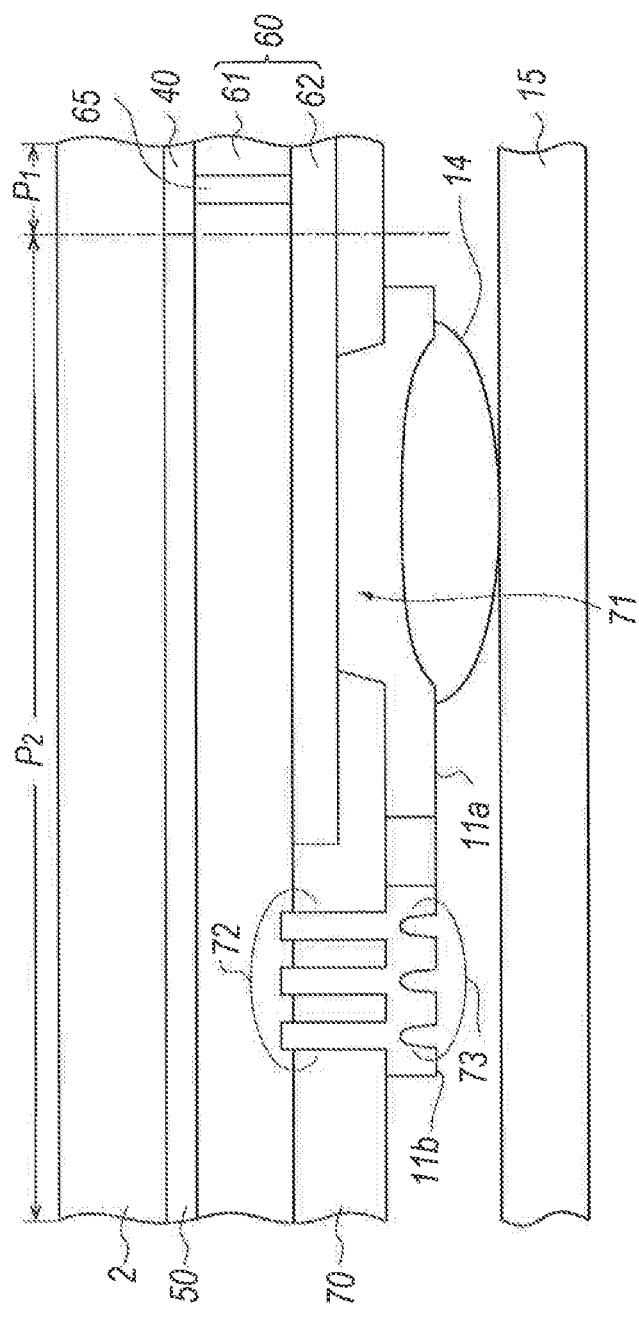
FIG. 4 schematically shows a cross section of the assembly including the semiconductor device of the first embodiment around the primary and subsidiary portion, where the semiconductor device is mounted on the support upside down.

Next embodiment according to the present invention will be described as referring to drawings. In the description of the drawings, numerals or symbols same with or similar to each other will refer to elements same with or similar to each other without duplicating explanations.

First Embodiment

FIG. 1 is a plan view schematically illustrating a semiconductor device 1 that provides a peripheral area $P_1$ and a device area $P_2$, the former area $P_1$ arranges pads of the first group 10, while, the latter area $P_2$ arranges an internal circuit 40. The circuit element is electrically connected to the first group of the pads 10 through interconnections 41a. to 41c.

The peripheral area. $P_1$ will be first described in detail. The semiconductor device 1, which is demarcated by edges, 1a to 1c, provides the first group of the pads 10 on a substrate 2. The first group of the pads 10 includes a signal pad 11 and ground pads, 12 and 13, in respective sides of the signal pad 11, where the signal pad 11 is to be probed by a signal terminal 81 of the probe 80 and the ground pads, 12 and 13, are to be probed by ground terminals, 82 and 83, of a probe 80 which will be shown in FIGS. 3A to 3C. The signal pad 11 and the ground pads, 12 and 13, include primary portions, 11a to 13a, and subsidiary portions, 11b to 13b. The present embodiment provides the pads, 11 to 13, having substantially same arrangements; accordingly, the explanation below will concentrate on the signal pad 11.

The semiconductor device 1 provides the internal circuit 40 and interconnections, 41a to 41c, where the internal circuit 40 includes semiconductor elements 42 electrically connected to the signal and ground pads, 11 to 13, through respective interconnections, 41a to 41c. The semiconductor device 1 may further provides a second group of pads 20 and a third group of pads 30, where the former group 20 is applicable to a testing of high frequency performance of the semiconductor device 1 same with the first group 10, while, the third group 30 is prepared for providing and outputting low frequency or DC signals.

FIG. 2A is a plan view magnifying the signal pad 11. As described, the semiconductor device 1 provides the signal pad 11 comprising the primary portion 11a and the subsidiary portion 11b positioned adjacent to the primary portion 11a and continuously extends from an edge of the signal pad 11. That is, the subsidiary portion 11b and the primary portion 11a are arranged in this order from the edge 1a of the semiconductor device 1 toward the internal circuit 40, which may avoid that the semiconductor device 1 in a lateral width thereof along the axis Ax2 is widened. The subsidiary portion 11b has a width $L_3$ less than a width $L_1$ of the primary portion 11a. Specifically, the primary portion 11a has the width $L_1$ of 100 to 300 μm, a length $L_2$ of 100 to 300 μm.

The subsidiary portion 11b, which is prepared for the testing of the semiconductor device 1, is electrically connected to the internal circuit 40 through the primary portion 11a. Even when the probing to the subsidiary portion 11b leaves scratches and/or damages on the subsidiary portion 11b during the testing of the internal circuit 40, the subsidiary portion 11b does not degrade the performance of the semiconductor device 1 because the subsidiary portion 11b does not operate as a current path after the assembly of the semiconductor device 1 on the support 15.

FIG. 2B shows a cross section of the semiconductor device 1 around the signal pad 11 thereof. Referring to FIG. 2B, the semiconductor device 1 provides a substrate 2, the internal circuit 40, an wiring structure 60, and an insulating layer 70 in the device area $P_2$ thereof; while the internal circuit 40 is replaced to a semiconductor layer 50 in the peripheral area $P_1$. Exactly, the internal circuit 40 formed in the semiconductor layer 50 in the device area $P_1$, but the semiconductor layer 50 is left as a raw layer in the peripheral area $P_2$. The substrate 2 may be made of GaAs, the internal circuit 40 may include transistors with a type of high electron mobility transistor (HEMT). The wiring structure 60 includes the metal layer 62 and an insulating layer 61 but is not restricted to those layers, 61 and 62, The wiring structure 60 may include two or more metal layers and insulating layers between the metal layers. The insulating layer 61 may be made of resin, such as polyimide with relatively smaller dielectric constant, which is preferable for high frequency performance of the semiconductor device 1. The metal layer 62 may be made of gold (Au), or metal stack including gold (Au). The internal circuit 40 is connected to the signal pad 11 through the metal layer 62 and a via hole 65 that may be filled with gold (Au). Accordingly, the metal layer 62 may be regarded as the interconnections, 41a to 41c, electrically connecting the semiconductor element 42 in the internal circuit 40 to the first group 10 of the pads.

In the present embodiment, the metal layer 62 is a topmost layer of the wiring structure 60, and provides an insulating layer 70 that covers the metal layer 62 and the insulating layer 61. The insulating layer 70, which may be made of polyimide, has a first opening 71 on the metal layer 62. The first opening 71 electrically connects the primary portion 11a to the metal layer 62. Also, the insulating layer 70 provides a second opening 72 in the subsidiary portion 11b. The second opening 72, which includes grooves 72a each extending along the axis Ax1, that is, the grooves 72a each has a rectangular shape with a longitudinal axis thereof extending inwardly from the edge 1a toward the device area $P_2$ along the direction Ax1. The grooves 72a are arrayed along the direction Ax2 perpendicular to the former direction Ax1. The subsidiary portion 11b fully covers the grooves 72a each having an aspect ratio of $L_6/W_1$, which is greater than an aspect ratio, $L_2/L_1$, of the first opening 71. The subsidiary portion 11b provides hollows 73 corresponding to the grooves 72a in the insulating layer 70. In the embodiment shown in FIGS. 2A and 2B, the subsidiary portion 11b provides three hollows 73 along the direction Ax2.

The subsidiary portion 11b may have a width $L_3$ of 60 to 150 μm and a length $L_4$ of 60 to 150 μm. An area for the hollows 73 has a width $L_5$ of 40 to 100 μm and a length $L_6$ of also 40 to 100 μm, while, the hollows 73 each has a width $W_1$ of 5 to 10 μm and a gap $W_2$ to the next hollow of 5 to 10 μm. The hollows 73 each have a depth $D_1$ of 1 to 3 μm.

Although the first opening 71 in the primary portion 11a has a bottom exposing the metal layer 62, the grooves 72a of the second opening 72 in the subsidiary portion 11b have bottoms exposing the insulating layer 61. As described layer, two openings, 71 and 72, may be concurrently formed in a common step. Accordingly, the grooves 72a has the depth $DT_2$ greater than a depth $DT_1$ of the former opening 71, which is the thickness of the insulating layer 70, by an amount depending on the etching rate of the insulating layer 70.

The second group of the pads 20 of the present embodiment may have hollows in the subsidiary portions thereof. However, the third group of the pads 30 in the subsidiary portions thereof is unnecessary to have the hollows because the third group of the pads 30 is provided for DC signals in the testing. A probe for the DC testing generally has a needle-like or pin-like shape, which may bend at the probing and disperse the pressure applied to the surface of the pads; accordingly, scratches and/or damages possibly caused in the pads may be effectively suppressed. On the other hand, a probe for testing high frequency performance generally provides a substrate including a transmission line to secure the high frequency performance thereof. Only a tip of the substrate provides a shortened contact pin. Accordingly, the probe for the high frequency testing is unable to disperse the pressure applied to the tip of the substrate into the whole probe, or into the whole pad. The hollows 73 in the subsidiary portion 11b may restrict the area for the probe to be in contact thereto, which may reduce friction; accordingly, accelerate the slide of the probe, disperse the pressure applied to the tip of the probe, and suppress the pad from being scratched and damaged. The subsidiary portion 11b has a thickness $H_1$ of 1 to 3 µm.

FIGS. 3A to 3C schematically show the probe 80 for the high frequency testing, which will be called as an RF (radio frequency) testing. The RF probe 80, as illustrated in FIG. 3A, which is a perspective view thereof, provides a signal terminal 81 and two ground terminals, 82 and 83, sandwiching the signal terminal 81 therebetween. The respective terminals, 81 to 83, have a tip width $W_3$ of 20 to 40 µm, and a length $W_4$ to be in contact to a pad of 20 to 40 µm.

FIG. 3B is a side view and FIG. 3C is a front view showing statuses when the RF probe 80 is in contact to the subsidiary portion 11b. Because the hollows 73 in the subsidiary portion 11b has the thickness of 1 to 3 µm, the tip of the RF probe 80, which is in contact to the subsidiary portion 11b, is apart from the bottom of the hollows 73 even when the RF probe 80 is pressed downward. Adjusting the width $W_1$ and the gap $W_2$ of the hollows 73, the area by which the RF probe 80 is in direct contact to the subsidiary portion 11b may be optionally selected.

Because the tests of the internal circuit in the DC mode and the RF mode are carried out by the subsidiary portion 11b not the primary portion 11a, the probe 80 is not in contact to the primary portion 11a at which means that the primary portion 11a. is free from scratches and/or damages. When the probe 80 abuts against the subsidiary portion 11b as sliding along the direction Ax1, the probe 80 is necessary to be pressed downward toward the subsidiary portion 11b in order to make the probe 80 securely in contact to the subsidiary portion 11b, which sometimes causes the probe 80 to adhere flakes of metals forming the subsidiary portion 11b. Because the subsidiary portion 11b in the surface thereof provides the hollows 73, a contact area of the probe 80 to the subsidiary portion 11b becomes narrower even when the probe 80 is abut against the subsidiary portion 11b with a substantial pressure to secure the contact, which makes the friction between the probe 80 and the subsidiary portion 11b smaller and the slide of the probe 80 on the surface of the subsidiary portion 11b smoother. Accordingly, lesser flakes are adhered to the probe 80 and fewer scratches are left on the surface of the subsidiary portion 11b. This is because of the hollows 73 extending in a direction along which the probe 80 slides.

The subsidiary portion 11b of the embodiment may include gold (Au) because the gold (Au) may reduce contact resistance of the probe 80 to the subsidiary portion 11b.

FIG. 4 schematically shows a cross section of an assembly 3 including the semiconductor device 1 of the first embodiment around the primary and subsidiary portions, and 11b, and a support 15 that mounts the semiconductor device 1 thereon. The semiconductor device 1 may provide, on the primary portion 11a, a solder ball 14 that not only makes an electrical contact between the semiconductor device 1 and a support 15 but mechanically connects the semiconductor device 1 to the support 15 to form the assembly 3. The solder ball 14 may be made of SnAgCu, which is a type of low melting point solder, while, the support 15 may be a package, a circuit board, and/or an assembly board. As shown in FIG. 4, the semiconductor device 1 is mounted on the support 15 in upside down, namely, the signal pad 11 faces the support 15.

Second Embodiment

Figure 5:
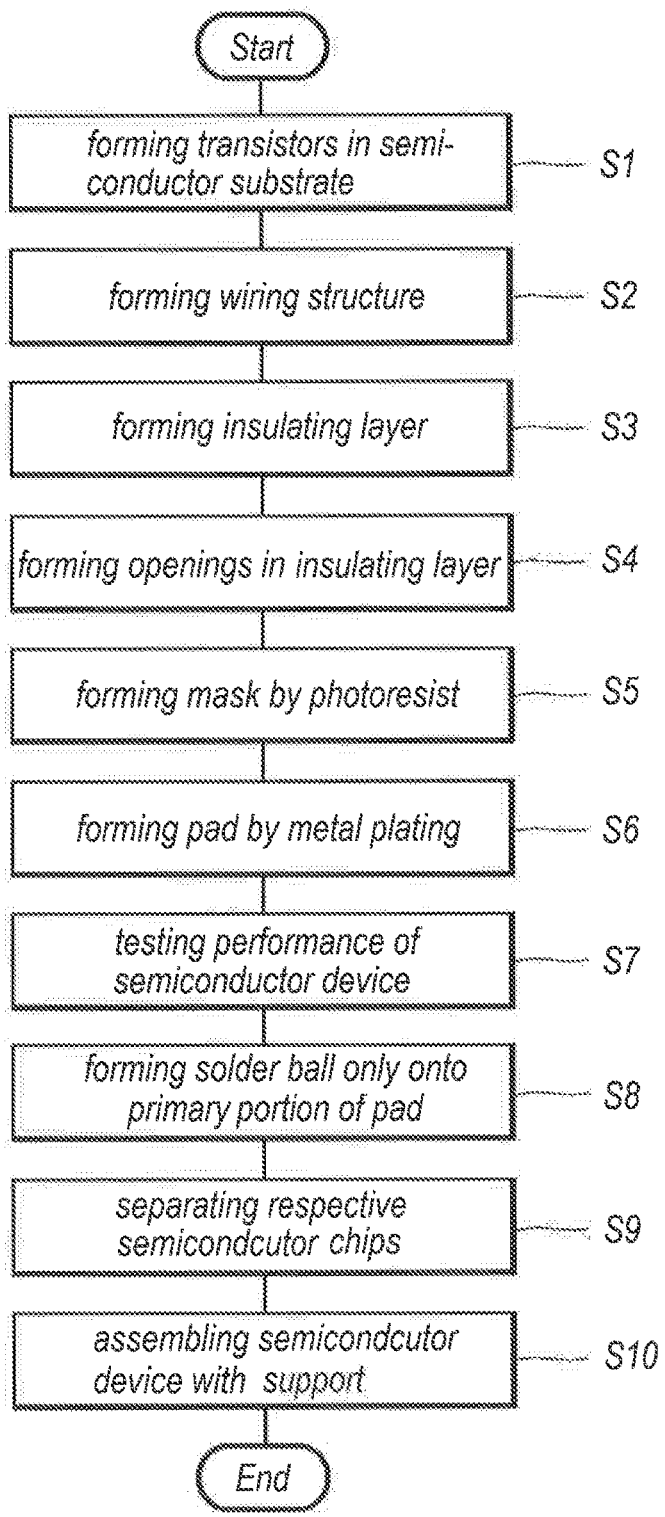
FIG. 5 shows a flow chart of a process to form the semiconductor assembly.

Next, the second embodiment according to the present application will be described. FIG. 5 shows a flow char to make the assembly 3 of the first embodiment, and FIGS. 6A to 14B show steps of the process to make the assembly 3, where FIGS. 6A to 14A are plan views of the assembly 3, and FIGS. 6B to 14B show cross sections thereof taken along respective lines, VIb-VIb to XIVb-XIVb, indicated in FIGS. 6A to 14A.

Figure 6A:
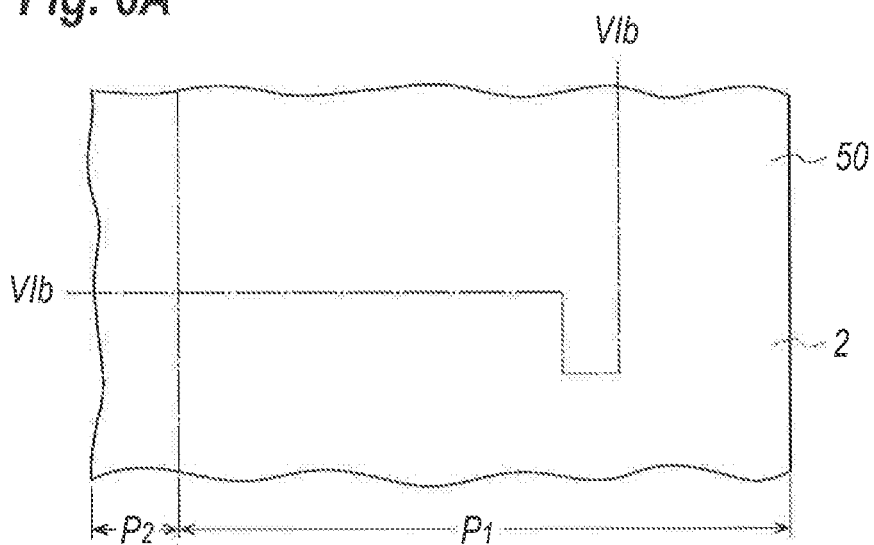
FIG. 6A is a plan view of the semiconductor device at a step of the manufacturing process thereof and FIG. 6B shows a cross section taken along the line VIb-VIb indicated in FIG. 6A.
Figure 6B:
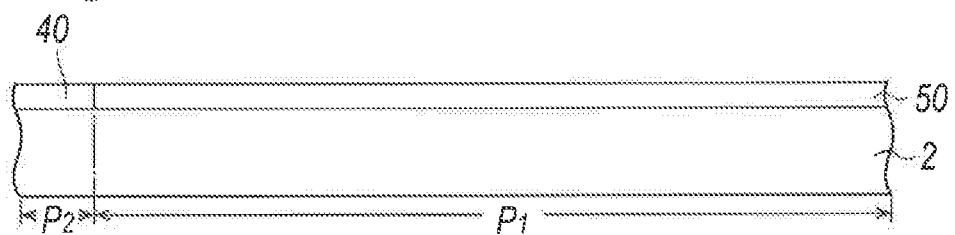

At step S1, the internal circuit 40 is formed on the substrate 2, as shown in FIGS. 6A and 6B. A metal organic chemical vapor deposition (MOCVD) or a molecular been epitaxy (MBE) may grow a semiconductor layer 50 that includes two or more semiconductor layers on a semiconductor substrate 2. The semiconductor element 42 implemented within the internal circuit 40 may be formed in the semiconductor layer 50.

At step S2 as shown in FIGS. 7A and 7B, the process forms the wiring structure 60. Specifically, the process forms, on the internal circuit 40 and the semiconductor layer 50, an insulating layer 61, and the metal layer 62. The insulating layer 61 may be formed by a plasma enhanced chemical vapor deposition (p-CVD). Step S2 further forms a via hole 65 in the insulating layer 61 by a dry-etching of the insulating layer 61. The metal layer 62 is electrically connected to the internal circuit 40 through the via hole 65. Although the embodiment provides only one metal layer 62 and one insulating layer 61, the semiconductor device 1 may two or more metal layers with two or more insulating layers therebetween.

At step S3, as shown in FIGS. 8A and 8B, another insulating layer 70 covers the wiring structure 60. The present embodiment provides the metal layer 62 in topmost of the wiring structure 60, and the other insulating layer 70 covers the insulating layer 61 and the metal layer 62. The insulating layer 70 may be formed also by the p-CVD. Then, the process forms a patterned mask 63 on the other insulating layer 70 to form the first opening 71 an the second opening 72, where the former opening 71 determines a position of the primary portion 11a on the other insulating layer 70, while, the latter opening 72 determines a position of the subsidiary portion 11b on the other insulating layer 70. The mask 63 has a striped shape having an arrayed pattern in the opening 72. The mask 63 may be made of photoresist.

Figure 9A:
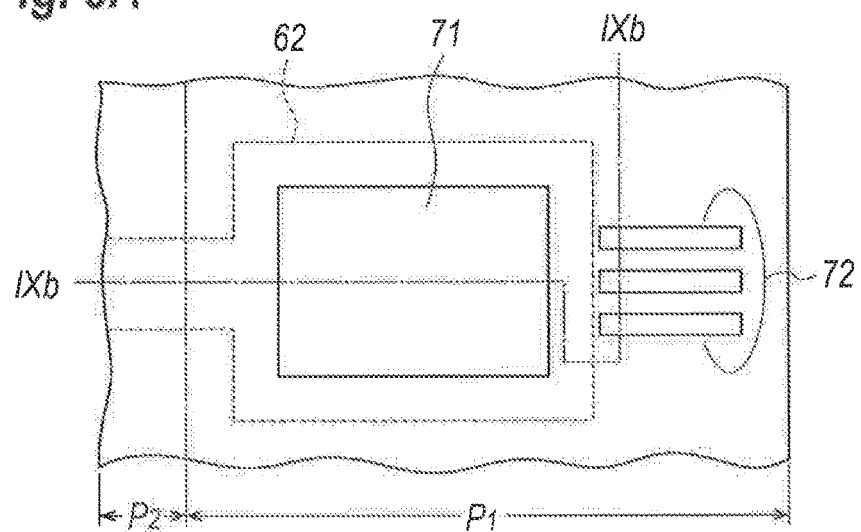
FIG. 9A is a plan view of the semiconductor device at a step of the manufacturing process subsequent to the step shown FIG. 8A.
Figure 9B:
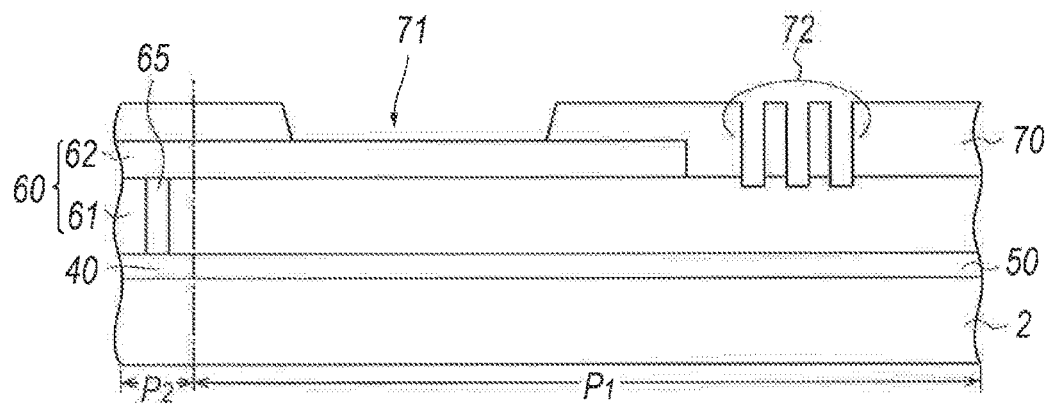
FIG. 9B shows a cross section taken along the line IXb-IXb indicated in FIG. 9A.
Figure 10A:
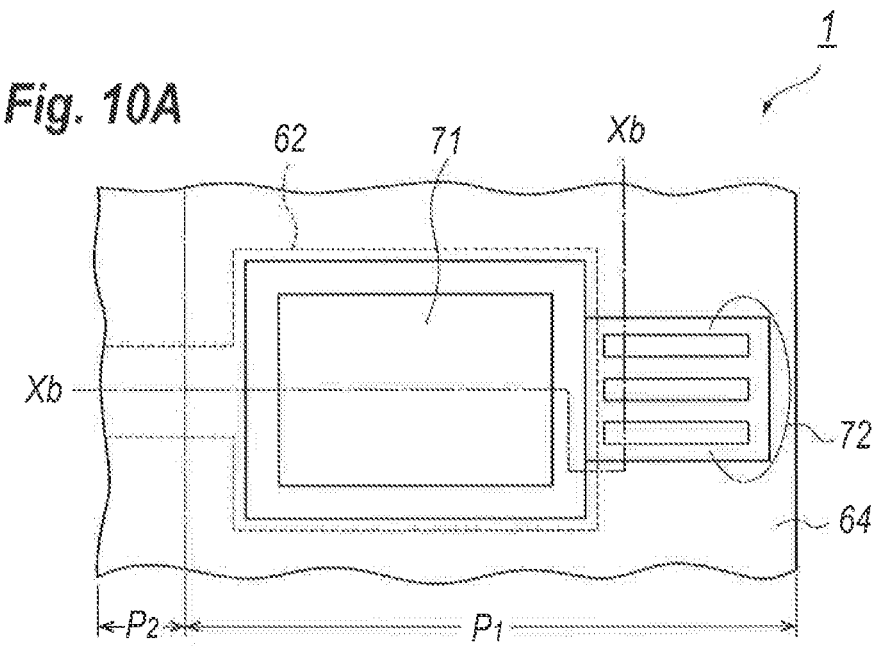
FIG. 10A is a plan view of the semiconductor device at a step of the manufacturing process subsequent to the step shown FIG. 9A.
Figure 10B:
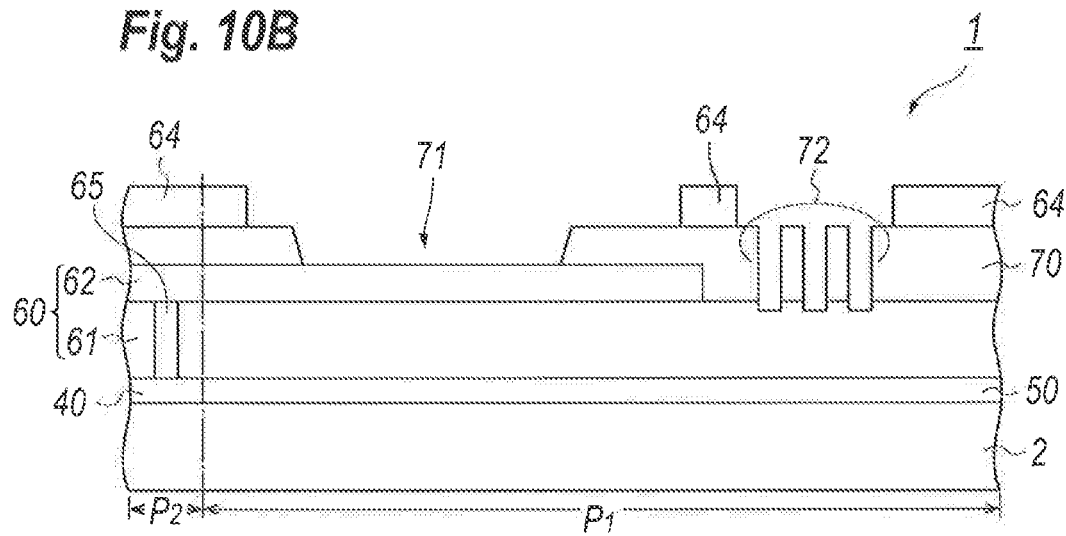
FIG. 10B shows a cross section taken along the line Xb-Xb indicated in FIG. 10A.

At step S4, as shown in FIGS. 9A and 9B, the process forms the first and second openings, 71 and 72, by etching the other insulating layer 70 using the mask 63. The first opening 71 has a size enough to make the metal layer 62 in electrically contact to the primary portion 11a. The second opening 72 includes two or more grooves 72a each having an aspect ratio greater than that of the first opening 71. Depending on the respective materials beneath the other insulating layer 70 in the openings, 71 and 72, that is, the former opening 71 is formed on the metal layer 62 while the latter opening 72 is formed on the insulating layer 61, the openings, 71 and 72, have respective depths, where the second opening 72 has the depth greater than that of the first opening 71. The mask 63 is removed by an organic solvent after the formation of the first and second openings, 71 and 72.

Step S5 prepares another mask 64, which may be also made of photoresist, for forming the signal pad 11. The mask 64 fully exposes and surrounds the openings, 71 and 72, and has a shape corresponding to plane shapes of the primary portion 11a and the subsidiary portion 11b. Subsequent to step S5, the process forms, at step S6, the signal pad 11 by the metal-plating using the mask 64 as shown in FIGS. 11A and 11B. The signal pad 11 may be made of gold (Au). The primary portion 11a is aligned with the first opening 71 and electrically connected to the metal layer 62. The subsidiary portion 11b is aligned with the second opening 72 and has hollows 73 each corresponding to the respective grooves 72a of the second opening 72. The mask 64 is removed after the formation of the signal pad 11.

Thus, the process may form the semiconductor device 1 that includes the signal pad 11 having the primary portion 11a for the final semiconductor assembly and the subsidiary portion 11b for the testing of the semiconductor device 1. Although not explicitly described, step S6 also forms the ground pads, 12 and 13, each providing the primary portions, 12a and 13a, for the semiconductor assembly and the subsidiary portions, 12b and 13b, for the testing.

Figure 12A:
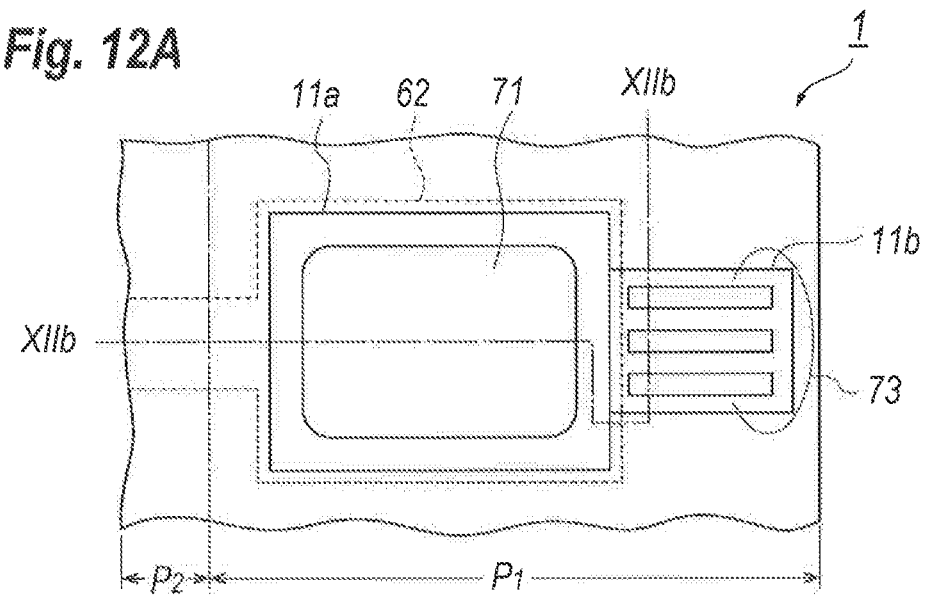
FIG. 12A is a plan view of the semiconductor device at a step of the manufacturing process subsequent to the step shown FIG. 11A.
Figure 12B:
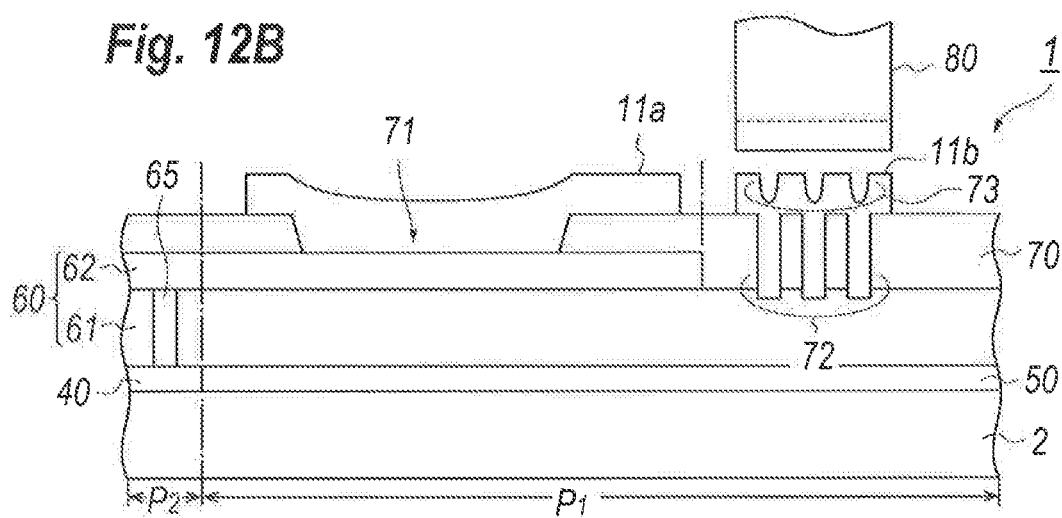
FIG. 12B shows a cross section taken along the line XIIb-XIIb indicated in FIG. 12A.

Step S7 tests performance of the semiconductor device 1 using the probe 80, as shown in FIGS. 12A and 12B. Making the probe 80 in tip ends thereof in contact to the subsidiary portions, 11b to 13b, the performance of the semiconductor device 1, in particular, the high-frequency performance of the semiconductor device 1 may be evaluated. Because the subsidiary portion 11b provides the hollows 73 extending along the direction substantially in parallel to the direction along which the ends of the probe 80 slide, the contact area of the probe 80 to the subsidiary portion 11b may be narrowed and, accordingly, less flakes may be adhered to the probe 80.

Step S8, as shown in FIGS. 13A and 13B, forms the solder ball 14 only on the primary portion 11a after the testing of the performance of the semiconductor device 1 by attaching the probe 80 to the subsidiary portion 11b, where the solder ball 14 may not only electrically connect the semiconductor device 1 to the substrate 2 but physically support the semiconductor device 1 on the substrate 2. The solder ball 14 may be a type of a bump electrode.

Figure 14A:
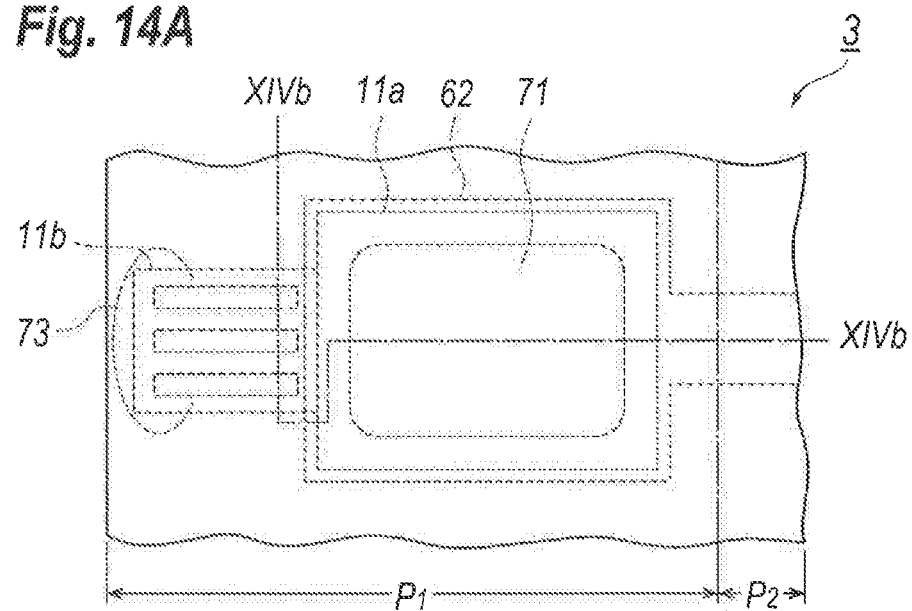
FIG. 14A is a plan view of the semiconductor device at a step of the manufacturing process subsequent to the step shown FIG. 13A.
Figure 14B:
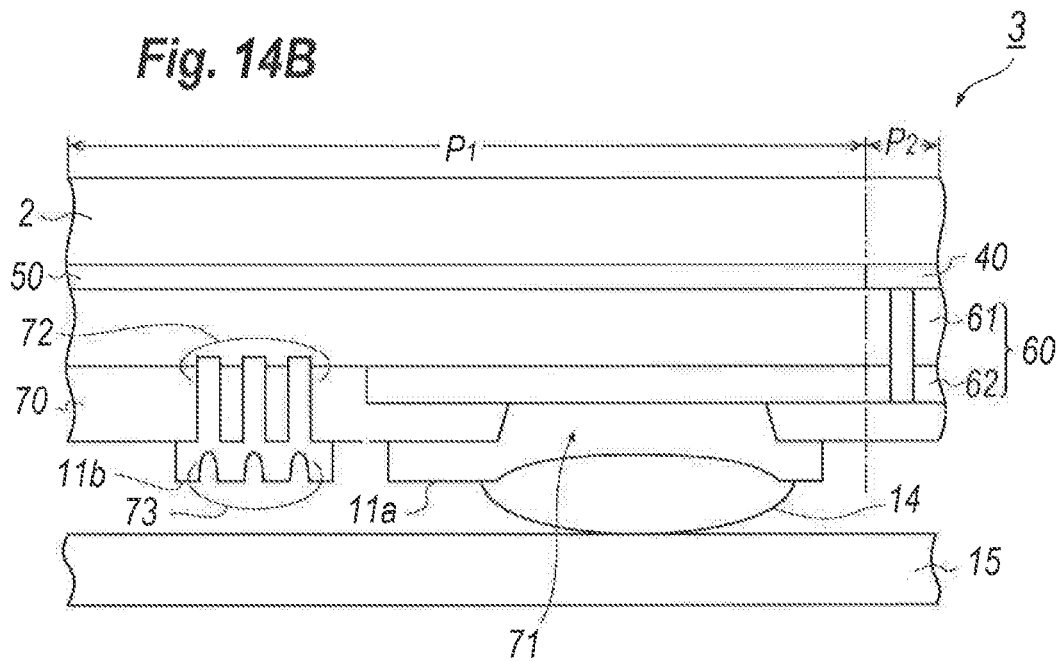
FIG. 14B shows a cross section taken along the line XIVb-XIVb indicated in FIG. 14A.

Step S9 places the semiconductor device 1 onto the support 15 as shown in FIGS. 14A and 14B. In advance to the placement, the semiconductor device 1, which is collectively formed on the semiconductor substrate 2 by the wafer process, is divided into respective chips, and the respective chips are placed onto respective supports 15, which may be a substrate made of insulating material and/or a package enclosing the semiconductor chip therein. The separation into the respective chips may be carried out by, for instance, cleaving and/or dicing the semiconductor wafer. Placing the semiconductor device 1 onto the substrate 15 such that the solder ball 14 is in contact to the substrate 15, exactly, electrically conducting patterns provided on the substrate 15, and a subsequent heat treatment may fix the semiconductor device 1 on the substrate 15 to form the semiconductor assembly 3. Although the subsidiary portion 11b of the signal pad leaves signs of the probing as already described above, those sings show no effect on the electrical performance of the assembly 3 because the subsidiary portion 11b is not utilized in the electrical connection.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

I claim:

1. A semiconductor assembly, comprising:
a semiconductor device including a device area and a peripheral area, the device area providing a semiconductor element, the peripheral area providing a signal pad connected to the semiconductor element in the device area through an interconnection, the signal pad including a primary portion and a subsidiary portion arranged outside of the primary portion with respect to the device area, the subsidiary portion having hollows extending in parallel toward the device area; and
a support that mounts the semiconductor device thereon in the primary portion through a metal member.

2. The semiconductor assembly of claim 1, further including:
a semiconductor layer that forms the semiconductor element in the device area;
an insulating layer that covers the semiconductor element and includes a wiring structure having the interconnection; and
another insulating layer covering the wiring structure and the insulating layer,
wherein the another insulating layer provides a first opening filled by the primary portion and a second opening filled by the subsidiary portion, the second opening including grooves corresponding to the hollows.

3. The semiconductor assembly of claim 2, wherein the grooves of the second opening in the another insulating layer have depths greater than a depth of the first opening.

4. The semiconductor assembly of claim 1,
wherein the primary portion and the subsidiary portion are connected along a direction extending through the device area, the primary portion and the subsidiary portion,
wherein the hollows in the subsidiary portion have depths of 1 to 3 µm, widths of 5 to 10 µm along a direction perpendicular to said direction through the device area, the primary portion and the subsidiary portion, and
wherein gaps between neighboring hollows are 5 to 10 µm.

5. The semiconductor assembly of claim 1, wherein the primary portion and the subsidiary portion have widths along a direction perpendicular to a direction extending through the device area, the primary portion, and the subsidiary portion, the width of the primary portion being greater than the width of the subsidiary portion.

6. The semiconductor assembly of claim 5, wherein the width of the subsidiary portion is 60 to 150 µm.

7. The semiconductor assembly of claim 1, wherein the subsidiary portion continuously extends from an edge of the primary portion in a direction away from the device area.

* * * * *